(12) United States Patent
Laboutin et al.

(10) Patent No.: US 10,580,871 B2
(45) Date of Patent: Mar. 3, 2020

(54) NUCLEATION LAYER FOR GROWTH OF III-NITRIDE STRUCTURES

(71) Applicant: IQE, plc, St. Mellons, Cardiff (GB)

(72) Inventors: Oleg Laboutin, South Easton, MA (US); Chen-Kai Kao, Lexington, MA (US); Chien-Fong Lo, Braintree, MA (US); Wayne Johnson, Hampstead, NC (US); Hugues Marchand, Somerville, MA (US)

(73) Assignee: IQE plc, St. Mellons, Cardiff (GB)

( * ) Notice: Subject to any disclaimer, the term of this patent is extended or adjusted under 35 U.S.C. 154(b) by 0 days.

(21) Appl. No.: 15/918,814

(22) Filed: Mar. 12, 2018

(65) Prior Publication Data

US 2018/0277639 A1  Sep. 27, 2018

Related U.S. Application Data

(63) Continuation of application No. 15/256,170, filed on Sep. 2, 2016, now Pat. No. 9,917,156.

(51) Int. Cl.
*H01L 27/146* (2006.01)
*H01L 29/20* (2006.01)
(Continued)

(52) U.S. Cl.
CPC ...... *H01L 29/2003* (2013.01); *H01L 21/0245* (2013.01); *H01L 21/0254* (2013.01);
(Continued)

(58) Field of Classification Search
CPC .......... H01L 29/2003; H01L 21/02581; H01L 21/02381; H01L 21/02505;
(Continued)

(56) References Cited

U.S. PATENT DOCUMENTS 4,481,523 A   11/1984  Osaka et al.
5,928,421 A    7/1999  Yuri et al.
(Continued)

FOREIGN PATENT DOCUMENTS

CN   1619843    5/2005
EP   2 047 501  4/2009
(Continued)

OTHER PUBLICATIONS

Feichtinger, Deep Centers in Semiconductors. Materials Science and Technology, 2013, Fig. 4-3, p. 173.
(Continued)

*Primary Examiner* — Nelson Garces
(74) *Attorney, Agent, or Firm* — Haley Guiliano LLP

(57) ABSTRACT

Nucleation layers for growth of III-nitride structures, and methods for growing the nucleation layers, are described herein. A semiconductor can include a silicon substrate and a nucleation layer over the silicon substrate. The nucleation layer can include silicon and deep-level dopants. The semiconductor can include a III-nitride layer formed over the nucleation layer. At least one of the silicon substrate and the nucleation layer can include ionized contaminants. In addition, a concentration of the deep-level dopants is at least as high as a concentration of the ionized contaminants.

14 Claims, 6 Drawing Sheets

(51) Int. Cl.
*H01L 21/02* (2006.01)
*H01L 29/205* (2006.01)
*H01L 29/207* (2006.01)
*H01L 29/36* (2006.01)
*H01L 29/66* (2006.01)
*H01L 29/778* (2006.01)

(52) U.S. Cl.
CPC .... *H01L 21/0262* (2013.01); *H01L 21/02381* (2013.01); *H01L 21/02458* (2013.01); *H01L 21/02505* (2013.01); *H01L 21/02579* (2013.01); *H01L 21/02581* (2013.01); *H01L 21/02631* (2013.01); *H01L 29/205* (2013.01); *H01L 29/207* (2013.01); *H01L 29/36* (2013.01); *H01L 29/66462* (2013.01); *H01L 29/7787* (2013.01)

(58) Field of Classification Search
CPC .......... H01L 21/02458; H01L 21/0245; H01L 21/0254; H01L 21/0262; H01L 21/02631; H01L 29/205; H01L 29/207; H01L 29/36; H01L 29/66431; H01L 29/66462; H01L 21/02579; H01L 2924/13064; H01L 29/778–7789; H01L 29/122–127; H01L 29/15–158
See application file for complete search history.

(56) References Cited

U.S. PATENT DOCUMENTS

| | | | |
|---|---|---|---|
| 6,139,628 A | 10/2000 | Yuri et al. | |
| 6,156,581 A | 12/2000 | Vaudo et al. | |
| 6,255,198 B1 | 7/2001 | Linthicum et al. | |
| 6,323,053 B1 | 11/2001 | Nishikawa et al. | |
| 6,391,748 B1 | 5/2002 | Temkin et al. | |
| 6,596,079 B1 | 7/2003 | Vaudo et al. | |
| 6,596,377 B1 | 7/2003 | Hersee et al. | |
| 6,617,060 B2 | 9/2003 | Weeks, Jr. et al. | |
| 6,818,061 B2 | 11/2004 | Peczalski et al. | |
| 6,835,246 B2 | 12/2004 | Zaidi | |
| 6,906,351 B2 | 6/2005 | Kryliouk et al. | |
| 6,929,867 B2 | 8/2005 | Armitage et al. | |
| 6,967,355 B2 | 11/2005 | Kryliouk et al. | |
| 7,001,791 B2 | 2/2006 | Kryliouk et al. | |
| 7,012,016 B2 | 3/2006 | Gwo | |
| 7,014,710 B2 | 3/2006 | Fang et al. | |
| 7,098,490 B2 | 8/2006 | Micovic et al. | |
| 7,135,715 B2 | 11/2006 | Saxler | |
| 7,247,889 B2 | 7/2007 | Hanson et al. | |
| 7,273,664 B2 | 9/2007 | Semond et al. | |
| 7,365,374 B2 | 4/2008 | Piner et al. | |
| 7,449,353 B2 | 11/2008 | Saxler | |
| 7,598,108 B2 | 10/2009 | Li et al. | |
| 7,708,832 B2 | 5/2010 | Kim et al. | |
| 7,781,356 B2 | 8/2010 | Kouvetakis et al. | |
| 7,803,717 B2 | 9/2010 | Rawdanowicz et al. | |
| 7,910,937 B2 | 3/2011 | Chen et al. | |
| 7,928,471 B2 | 4/2011 | Mastro et al. | |
| 7,935,987 B2 | 5/2011 | Schulze et al. | |
| 7,989,925 B2 | 8/2011 | Cheng et al. | |
| 8,169,003 B2 | 5/2012 | Murphy et al. | |
| 8,217,498 B2 | 7/2012 | Bhat et al. | |
| 8,268,646 B2 | 9/2012 | Kryliouk et al. | |
| 8,278,125 B2 | 10/2012 | Chen et al. | |
| 8,362,503 B2 | 1/2013 | Saxler et al. | |
| 8,389,348 B2 | 3/2013 | Thei et al. | |
| 8,390,027 B2 | 3/2013 | Iwamuro | |
| 8,461,666 B2 | 6/2013 | Tu et al. | |
| 8,507,947 B2 | 8/2013 | Ramdani et al. | |
| 8,519,414 B2 | 8/2013 | Yu et al. | |
| 8,686,430 B2 | 4/2014 | Chen | |
| 8,697,541 B1 | 4/2014 | Kumar | |
| 8,722,526 B2 | 5/2014 | Lee | |
| 8,742,459 B2 | 6/2014 | Mishra et al. | |
| 8,872,308 B2 | 10/2014 | Arkun et al. | |
| 8,916,906 B2 | 12/2014 | Fenwick | |
| 8,969,178 B2 | 3/2015 | Lee et al. | |
| 2001/0008656 A1 | 7/2001 | Tischler et al. | |
| 2001/0015437 A1 | 8/2001 | Ishii et al. | |
| 2005/0106849 A1 | 5/2005 | Gwo | |
| 2005/0121661 A1* | 6/2005 | Beach | H01L 29/2003 257/11 |
| 2006/0154455 A1 | 7/2006 | Guo et al. | |
| 2007/0141823 A1 | 6/2007 | Preble et al. | |
| 2008/0171424 A1 | 7/2008 | Li et al. | |
| 2008/0173895 A1 | 7/2008 | Maa et al. | |
| 2008/0283821 A1 | 11/2008 | Park et al. | |
| 2008/0315255 A1 | 12/2008 | Maa et al. | |
| 2009/0075455 A1 | 3/2009 | Mishra | |
| 2010/0035416 A1 | 2/2010 | Chen et al. | |
| 2010/0117118 A1 | 5/2010 | Dabiran et al. | |
| 2010/0133658 A1 | 6/2010 | Dadgar et al. | |
| 2010/0176369 A2 | 7/2010 | Oliver et al. | |
| 2012/0068191 A1 | 3/2012 | Marchand et al. | |
| 2012/0126239 A1 | 5/2012 | Keller et al. | |
| 2013/0026480 A1 | 1/2013 | Fenwick et al. | |
| 2013/0099243 A1 | 4/2013 | Chen et al. | |
| 2013/0200495 A1 | 8/2013 | Keller et al. | |
| 2013/0207078 A1 | 8/2013 | Laboutin et al. | |
| 2013/0270575 A1 | 10/2013 | Humphreys et al. | |
| 2014/0014967 A1 | 1/2014 | Chen et al. | |
| 2014/0197462 A1 | 7/2014 | Briere | |
| 2014/0284609 A1 | 9/2014 | Vielemeyer | |
| 2015/0001582 A1 | 1/2015 | Laboutin et al. | |
| 2015/0028345 A1* | 1/2015 | Wong | H01L 29/7787 257/76 |
| 2015/0041825 A1* | 2/2015 | Liu | H01L 29/66462 257/77 |
| 2015/0221757 A1* | 8/2015 | Nakayama | H01L 27/0605 257/20 |

FOREIGN PATENT DOCUMENTS

| | | |
|---|---|---|
| EP | 2 767 620 | 8/2014 |
| WO | WO-2011/071717 | 6/2011 |

OTHER PUBLICATIONS

Sten Heikman et al., "Growth of Fe Doped Semi-Insulating GaN by Metalorganic Chemical Vapor Deposition," Applied Physics Letter, vol. 81, No. 3, Jul. 15, 2002, 4 pages.

International Search Report and Written Opinion in PCT Application No. PCT/US2017/049783, dated Nov. 23, 2017, 11 pages.

* cited by examiner

NUCLEATION LAYER FOR GROWTH OF III-NITRIDE STRUCTURES

CROSS-REFERENCE TO RELATED APPLICATIONS

This application is a continuation application of U.S. patent application Ser. No. 15/256,170, filed Sep. 2, 2016, now allowed, the disclosure of which is hereby incorporated by reference herein in its entirety.

BACKGROUND

High electron mobility transistors (HEMT's) grown on high resistivity silicon (Si) can have degraded performance due to contamination during fabrication. When a III-nitride layer is grown on a high resistivity Si substrate for use in a HEMT structure, acceptor contaminant species can deposit on and/or diffuse to the top surface of the Si substrate, causing a p-type region to form there upon ionization of the acceptors. The p-type region can have a high free hole concentration, resulting in a parasitic conductive channel. The parasitic channel results in parasitic capacitance that reduces the transistor performance at high frequencies.

In addition, the surface of the Si substrate can be contaminated with oxygen, carbon, and other elements. The contaminants and impurities may include species deposited on the surface of the substrate after desorbing from the chamber walls, adventitious carbon-containing species arising from species present in the environment, and/or a native oxide resulting from oxidation of the substrate by oxygen present in the ambient environment. These contaminants and impurities can lead to the formation of a highly defective interface between the Si and the III-nitride layer. This surface contamination and related defects can reduce the quality of the subsequent III-nitride epitaxial layers and structures. This reduced quality causes reduced electron mobility, deteriorating transistor performance, especially at high-voltage and high-current conditions.

SUMMARY

Accordingly, nucleation layers for growth of III-V and III-nitride structures, and methods for growing the nucleation layers, are described herein. A semiconductor can include a substrate and a nucleation layer over the substrate. The nucleation layer can include deep-level dopants. The semiconductor can include a III-V layer formed over the nucleation layer. At least one of the substrate and the nucleation layer can include ionized contaminants. In addition, a concentration of the deep-level dopants is at least as high as a concentration of the ionized contaminants.

The substrate can include a substrate material, and the deep-level dopants can include a deep-level dopant species having deep-level states that are separated from the conduction and valence bands of the substrate material by between 0.3 eV and 0.6 eV. The semiconductor can include a heterostructure between the substrate and the nucleation layer.

The deep-level dopant can include one or more of vanadium, iron, sulfur, and other chemical elements. The ionized contaminants can include a Group III species. The ionized contaminants can include ionized acceptor contaminants.

The concentration of the deep-level dopants can be between $10^{15}$ cm$^{-3}$ and $10^{19}$ cm$^{-3}$, and/or between $10^{16}$ cm$^{-3}$ and $10^{18}$ cm$^{-3}$. A concentration of free holes in the substrate and in the nucleation layer can be less than $10^{16}$ cm$^{-3}$ and/or less than $10^{15}$ cm$^{-3}$.

A thickness of the nucleation layer can be between 1 nm and 100 nm, between 10 nm and 1 µm, and/or between 100 nm and 10 µm.

A first concentration of the deep-level dopants at the surface of the nucleation layer nearest the substrate can be higher than a second concentration of the deep-level dopants at the surface nearest the III-V layer. The substrate material can be silicon. The III-V layer can be a III-nitride layer.

The nucleation layer and III-V layer can be grown by one or more of metalorganic chemical vapor deposition, molecular beam epitaxy, halide vapor phase epitaxy, and physical vapor deposition.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

Figure 1:
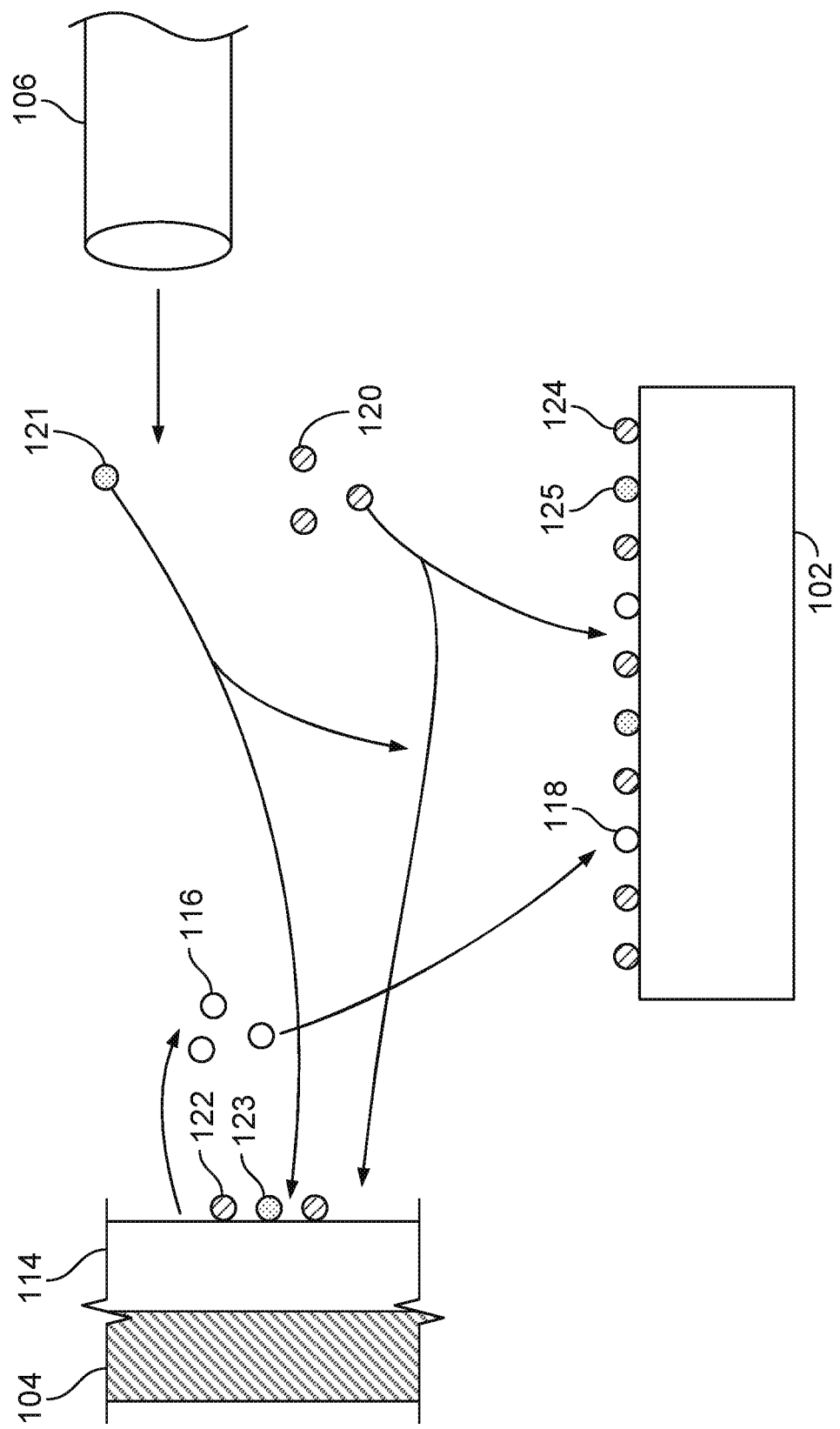
FIG. 1 depicts initial growth of a compensated nucleation layer using metalorganic chemical vapor deposition (MOCVD), according to an illustrative implementation.

The systems, devices, and methods described herein include, among other things, semiconductors having a nucleation layer that may achieve improved performance. Though not to be bound by theory or a proposed mechanism of action, it is noted for purposes of clarity and instruction that the nucleation layer may mitigate problems caused by parasitic channels and contamination in at least two ways. First, doping the nucleation layer with deep-level dopant species may compensate for free holes generated by the ionized acceptor dopants. Second, growth of the nucleation layer may clean the substrate surface, and the nucleation layer can physically bury contaminants and impurities and related defects, such as dislocations. The semiconductor can include semiconducting, conducting, and insulating materials. The semiconductor may include wafers covered with one or more blanket layers, wafers with one or more patterned layers, wafers with metal interconnects, wafers with functioning transistors, wafers with integrated circuits, one or more separated portions of wafers such as a die or multiple dice, and die or dice that have been packaged.

Although the systems, devices and methods described herein are not limited to any particular mechanism of action, it is noted for purposes of clarity that the deep-level dopants may act as deep-level traps and may compensate for the ionized acceptor dopants that deposit on or diffuse to the substrate surface. As deep-level traps, the deep-level dopants provide recombination centers, and trap and localize free holes caused by the ionized acceptor contaminants. The holes may be bound to the deep-level dopants and are not delocalized (free) throughout the substrate or nucleation layer. This trapping is understood to lower the free hole concentration near the surface of the substrate, making the region more resistive.

It is also understood and noted for purposes of clarity, that the nucleation layer may physically bury contaminants and impurities that deposit on, or have reacted with the top surface of the substrate. A reducing atmosphere (typically comprising $H_2$ gas) occurring before and during growth of the nucleation layer is understood to remove some or all of the carbon- and oxygen-containing contaminants and impurities, but the nucleation layer buries any contaminants and impurities that remain. In addition, the nucleation layer can be thick enough so that dislocations terminate within it and the upper surface of the nucleation layer has a reduced dislocation density. By burying contaminants, impurities, and the dislocations they cause, it is understood that the nucleation layer provides a clean surface for growth of a subsequent III-nitride layer. The III-nitride layer is a layer comprising a Group III species and nitrogen. The Group III species can include one or more element in Group III of the Periodic Table, including B, Al, Ga, In, and Tl. The III-nitride layer can be a compound that includes multiple Group III elements. The III-nitride layer can include binary compounds such as GaN, ternary compounds such as $Al_xGa_{1-x}N$ ($0 \leq x \leq 1$) and $In_xGa_{1-x}N$ ($0 \leq x \leq 1$), quaternary compounds such as $In_xAl_yGa_{1-x-y}N$ ($0 \leq x, y \leq 1$), and quinary compounds such as $Ga_xIn_{(1-x)}As_ySb_zN_{(1-y-z)}$ ($0 \leq x, y, z \leq 1$). The III-nitride layer can be undoped, unintentionally doped, or doped with donor or acceptor dopants. Throughout this disclosure, a III-nitride layer is described in detail as an example of a III-V layer. However, III-nitride materials are but a subset of III-V materials, and layers and materials described herein as III-nitride layers and materials can be replaced with other III-V layers and materials. III-V layers and materials include one or more species from Group III of the Periodic Table (such as the examples listed above) and one or more species from Group V of the Periodic Table (such as N, P, As, Sb, and Bi). As later described with reference to FIG. 4, examples of other III-V materials include one or more of GaAs, InP, InAs, InSb, InGaAs, GaAsP, InGaAsP, and the like.

FIG. 1 depicts initial growth of a compensated nucleation layer using metalorganic chemical vapor deposition (MOCVD). FIG. 1 depicts a substrate 102, a chamber wall 104, a residue layer 114 on the chamber wall 104, and a precursor inlet 106. The substrate 102 can be any substrate used for growth of III-nitride materials. The substrate 102 can be a silicon substrate, a high-resistivity silicon substrate, a silicon-on-insulator (SOI) substrate, and/or any type of composite substrate in which the top surface comprises silicon. The above substrates and other substrates can include single-crystal wafers that are undoped, unintentionally doped, or doped with donor or acceptor dopants. In the example of a high-resistivity silicon substrate, the substrate can have a resistivity of greater than 1,000 ohm-cm, greater than 2,000 ohm-cm, greater than 3,000 ohm-cm, greater than 6,000 ohm-cm, or greater than 10,000 ohm-cm. The substrate 102 can be a silicon (111) substrate to facilitate epitaxial growth of III-nitride materials, or the substrate 102 can include silicon with another crystal orientation such as silicon (100).

The precursor inlet 106 schematically represents a precursor delivery system, which injects the various precursors required to deposit silicon and III-nitride layers on the substrate 102. As depicted in FIG. 1, the precursor injector 106 is injecting a gas-phase silicon precursor 120 and a gas-phase dopant precursor 121.

Elevating the temperature of the chamber wall 104 is understood to cause components of the residue layer 114 to desorb as gas-phase contaminant species 116. The residue layer 114 can be a III-nitride material that was deposited on the chamber wall 104 during previous operation of the deposition system. Thus, the contaminant species 116 can be a Group III species which would act as a p-type dopant in silicon. A portion of the gas-phase species 120, 121, and 116 deposit on the substrate 102 as surface species 124, 125, and 118, respectively. The surface species 124, 125, and 118 can be physisorbed or chemisorbed, and can be cracked or uncracked. The silicon surface species 124 is the dominant species on the surface of the substrate 102, but the dopant surface species 125 and the contaminant surface species 118 are present in concentrations high enough to affect the doping level of the film that is subsequently grown on the substrate 102. In some examples, the flow of the gas-phase precursor species 121 from the precursor injector 106 is adjusted such that the concentration of the dopant species 125 on the substrate 102 is substantially the same as the concentration of the contaminant species 118 on the substrate 102. If diffusion from subsequently deposited layers is expected, the flow of the gas-phase precursor species 121 can be adjusted to result in a concentration of the dopant species 121 that is higher than the concentration of the contaminant species 118. In addition, some of the silicon precursor species 120 and the dopant species 121 deposit as surface species 122 and 123, respectively, on the residue layer 114.

The silicon precursor species 120 can include one or more silicon CVD precursors. Examples of silicon CVD precursors include silane, disilane, trisilane, dichlorosilane, trichlorosilane, methylsilane, diterttiarybutylsilane, silicon tetrachloride, silicon tetrafluoride, silicon tetrabromide, tetraethoxysilane, elemental silicon, and higher-order silanes and chlorosilanes.

The dopant species 121 can include one or more CVD precursors that deliver deep-level dopants. Examples of deep-level dopants include sulfur, selenium, vanadium, iron, tantalum, tellurium, chromium, manganese, or other chemical elements. Examples of CVD precursors that deliver sulfur include hydrogen sulfide ($H_2S$), ditert-butylsulphide, bis(trimethylsilyl)sulfide, (R)-(+)-t-butylsulfinamide, diethylsulfide, polypropylene sulfide, diisopropylsulfide, elemental sulfur, and organics, cyclopentadienyls, amines, aminidates, halides, and aromatics containing sulfur.

Examples of CVD precursors that deliver selenium include hydrogen selenide ($H_2Se$), dimethylselenide, ditert-butylselenide, elemental selenium, and other chemical compounds containing selenium.

Examples of CVD precursors that deliver vanadium include bis(cyclopentadienyl)vanadium(II), vanadium(V) oxytriisopropoxide, tetrakis(dimethylamino)vanadium(IV), tetrakis(diethylamino)vanadium(IV), elemental vanadium, and organometallics, and cyclopentadienyls, amines, aminidates, halides, and aromatics containing vanadium.

Examples of CVD precursors that deliver iron include bis(cyclopentadienyl)iron (also known as ferrocene), butylferrocene, dichlorophosphinoferrocene, ethylferrocene, elemental iron, and cyclopentadienyls, amines, aminidates, halides, elemental vanadium, and aromatics containing iron.

Examples of the contaminant species 118 include boron, aluminum, gallium, indium, thallium, and nitrogen.

Figure 2:
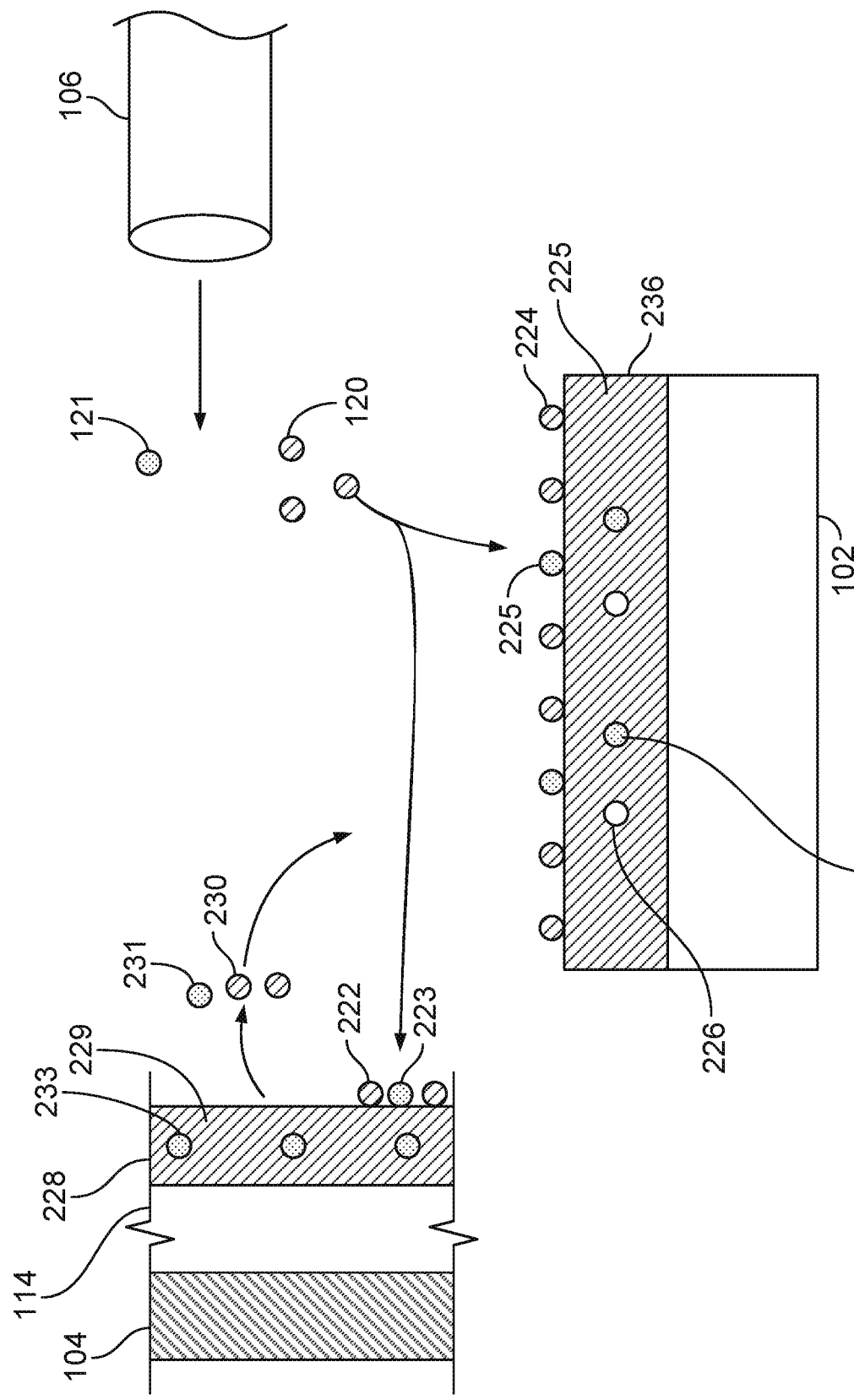
FIG. 2 depicts the formation of an epitaxial nucleation layer at a time after the initial nucleation depicted in FIG. 1, according to an illustrative implementation.

FIG. 2 depicts the formation of an epitaxial nucleation layer 236 at a time after the initial nucleation depicted in FIG. 1. The surface species 124, 125, and 118 depicted in FIG. 1 have coalesced into a nucleation layer 236. The nucleation layer 236 is an epitaxial layer that is lattice-matched to, or is at least pseudomorphic with, the substrate 102. The nucleation layer 236 can be a silicon layer. If the substrate 102 is a silicon substrate and/or includes silicon as a substrate material, the nucleation layer 236 can be a homoepitaxial silicon layer. Homoepitaxy refers to the epitaxial growth of a material on a substrate having at least a top surface of the same material. However, a homoepitaxial layer can include different doping characteristics (such as dopant species and concentration) than the material below. The nucleation layer 236 contains silicon 225, deep-level dopant species 227, and ionized acceptor contaminant species 226, resulting from incorporation of the surface species 124, 125, and 118, respectively. The ionized acceptor contaminant species 226 can include Group III species such as B, Al, Ga, In, and Tl. The deep-level dopant species 227 can include one or more of S, Se, V, Fe, Ta, Te, Cr, Mn, and other chemical elements. The deep-level dopant species 227 and the ionized acceptor contaminant species 226 can be interstitial or substitutional impurities. In some examples, one or both of the species 226 and 227 are interstitial impurities as deposited and become substitutional impurities after annealing. The annealing can occur in the deposition chamber or in a separate chamber.

When using a high-resistivity silicon wafer as the substrate 102, the presence of p-type dopants as the contaminant species 118 could lead to p-type doping of the substrate 102. The free holes resulting from this p-type doping could lead to the formation of a low-resistivity (high mobility) parasitic channel in the substrate 102. However, supplying a deep-level dopant that contains deep-level donor states as the dopant species 121 results in the deep-level dopant species 227 trapping the free holes, thus compensating for the p-type doping. When the concentration of the deep-level dopant species 227 is at least as high as the concentration of the ionized acceptor contaminant species 226, the deep-level dopant species 227 compensates for the free holes generated by the ionized acceptor contaminant species 226, preventing the formation of a parasitic channel and maintaining the high resistivity of the substrate 102.

As described herein, the electrical activity of both deep-level dopants and acceptor contaminants is approximately 1. The electrical activity of a species refers to the fraction of atoms of that species that are ionized. Thus, nearly all of the acceptors and deep-level dopants are ionized and the concentration of ionized acceptors or deep-level dopants is approximately equivalent to the concentration of acceptor contaminant species or deep-level dopants. However, in some examples, the electrical activity of the deep-level dopants and/or the acceptors is less than 1. In these examples, the concentration of ionized deep-level dopants is at least as high as the concentration of ionized acceptors. Concentrations of dopants and charge carriers are sometimes expressed in units of electrons-$cm^{-3}$, holes-$cm^{-3}$, or atoms-$cm^{-3}$, but more often, the name of the particle is omitted while referencing the same quantity and such concentrations are simply expressed in units of $cm^{-3}$. A concentration of deep-level dopant species that is at least as large as a concentration of ionized acceptor contaminant species can include a concentration of deep-level dopant species that is more than 10% lower than, approximately 10% lower than, approximately 5% lower than, approximately equal to, approximately 5% greater than, approximately 10% greater than, or more than 10% greater than the concentration of ionized acceptor contaminant species.

If the concentration of ionized acceptor contaminant species is larger than the concentration of deep-level dopant species, the free hole concentration in the nucleation layer and the nearby portion of the substrate will be the difference between the concentration of ionized acceptor contaminant species and the concentration of deep-level dopant species. Thus, a concentration of deep-level dopant species that is 10% lower than the concentration of ionized acceptor contaminant species will result in a reduction in free hole concentration of an order of magnitude, compared to a semiconductor without deep-level dopants.

If the concentration of deep-level dopant species is exactly equal to the concentration of ionized acceptor contaminant species, a fully compensated condition exists and the free hole and electron concentrations in the nucleation layer and the nearby portion of the substrate will be negligible, due only to thermally generated carriers.

If the concentration of deep-level dopant species is larger than the concentration of ionized acceptor contaminant species, a fully compensated condition also exists and the free hole and electron concentration in the nucleation layer and the nearby portion of the substrate will also be negligible, due only to thermally generated carriers. The concentrations of thermally generated carriers in fully compensated conditions are negligible because the deep-level dopant species do not have any electron energy states within several multiples of kT (up to 0.3-0.6 eV) from either the conduction or valence bands of silicon. Here, k refers to Boltzmann's constant and T refers to the temperature of the semiconductor in Kelvins.

At the time depicted in FIG. 2, the surface species 122 and 123 have coalesced into a residue layer 228 that covers the residue layer 114. The residue layer 228 includes silicon material 229 and dopant species 233.

The gas-phase precursor species 120 and 121 continue to travel to the substrate 102 and deposit as surface species 224 and 225, respectively. In addition, the gas-phase species 120 and 121 travel to the wall 104 and deposit on the residue layer 228 as surface species 222 and 223, respectively.

The residue layer 228 is at an elevated temperature due to the growth conditions and thus some of its component species desorb as silicon species 230 and dopant species 231. The desorbed species 230 and 231 can also travel to the substrate 102 and deposit as surface species. However, because the residue layer 228 covers the residue layer 114, contaminant species such as the contaminant species 116 do not desorb. Thus, once the residue layer 228 has formed, it prevents further p-type dopants, such as Group III elements, from depositing on the substrate 102. Furthermore, because the concentration of deep-level dopant species 227 is at least as high as the concentration of ionized acceptor contaminant species 226, the substrate 102 does not contain a parasitic channel.

Figure 3:
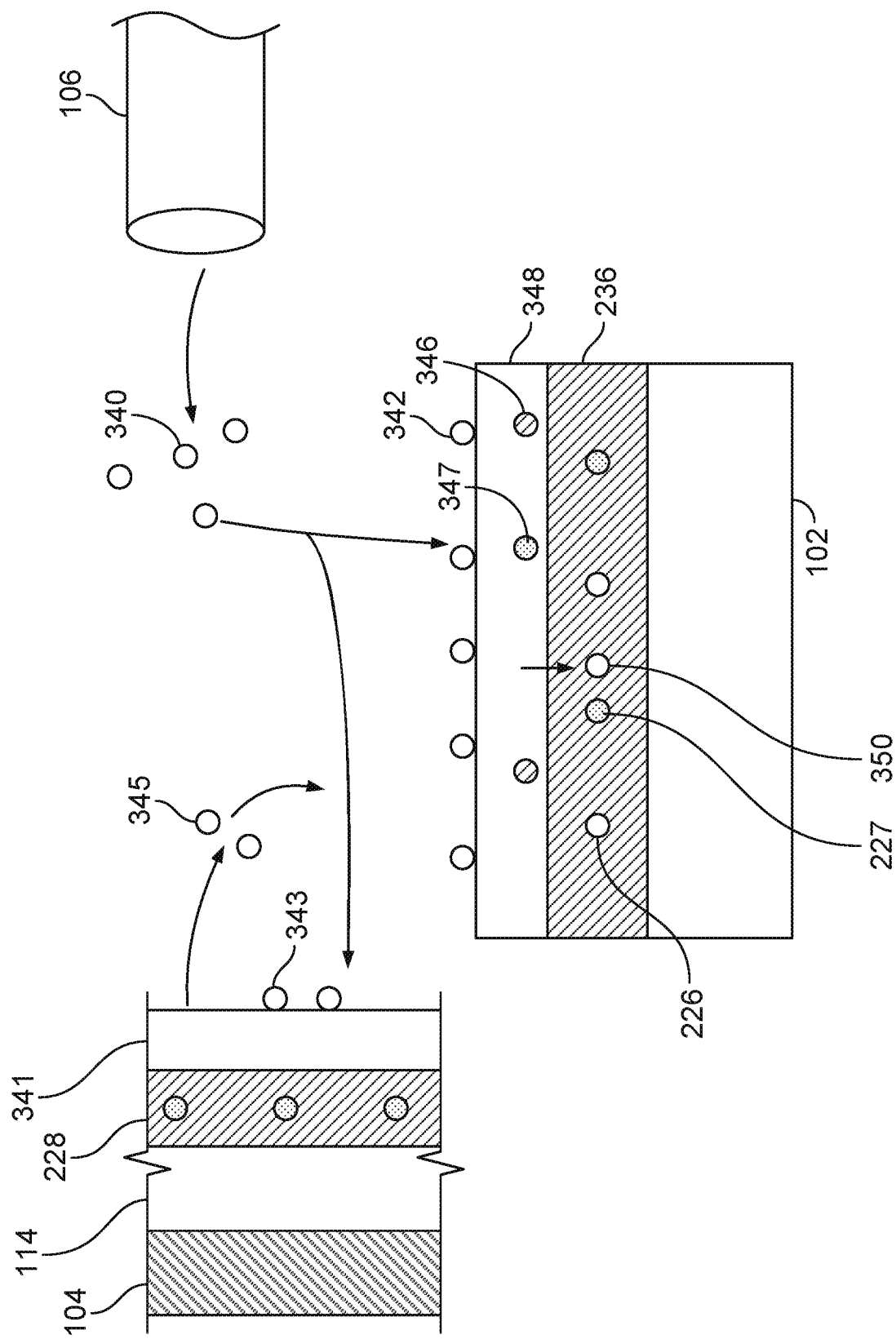
FIG. 3 depicts the formation of a III-nitride layer on a substrate at a time after the time depicted in FIG. 2, according to an illustrative implementation.

FIG. 3 depicts the formation of a III-nitride layer on the substrate 102 at a time after the time depicted in FIG. 2. In FIG. 3, the precursor injection system 106 delivers III-nitride precursors 340. The III-nitride precursors 340 can include multiple species of precursor and can be injected by different precursor delivery lines. The III-nitride precursors can include precursors that deliver Group III elements such as boron, aluminum, gallium, indium, and thallium, and/or nitrogen.

Examples of precursors that deliver aluminum include trimethylaluminum, triethylaluminum, dimethylaluminumhydride, dimethylethylamine alane, triisobutylaluminum, tris(dimethylamido)aluminum(III), aluminum trichloride, elemental aluminum, and alkyls, alkylamides, alkoxides, amidinates, β-diketonates, carbonyls, cyclopentadienyls, and organometallics containing aluminum.

Examples of precursors that deliver gallium include trimethylgallium, triethylgallium, tris(dimethylamido)gallium (III), gallium trichloride, diethylgallium chloride, triisobutylgallium, elemental gallium, and alkyls, alkylamides, alkoxides, amidinates, β-diketonates, carbonyls, cyclopentadienyls, and organometallics containing gallium.

Examples of precursors that deliver indium include trimethylindium, triethylindium, dimethylethylindium, indium trichloride, elemental indium, and alkyls, alkylamides, alkoxides, amidinates, β-diketonates, carbonyls, cyclopentadienyls, and organometallics containing indium.

Examples of precursors that deliver nitrogen include ammonia, 1.1-dimethylhydrazine, tert-butylamine, phenylhydrazine, elemental nitrogen, and other gases and organometallics containing nitrogen.

The III-nitride precursors travel to the substrate 102 and deposit as surface species 342. The precursor species 340 also travels to the wall 104 and deposits as surface species 343. As the deposition progresses, the surface species 343 form a III-nitride layer 341 over the residue layer 228. Likewise, the surface species 342 form a III-nitride layer 348 over the silicon layer 236 on the substrate 102. The III-nitride layer 346 can include one or more Group III elements.

Because of the elevated temperature of the wall 104, III-nitride species 345 will desorb from the III-nitride layer 341. The III-nitride species 345 can then deposit on to the substrate 102 as surface species 342. However, once the III-nitride layer 341 is continuous and dense, it prevents the sublimation of silicon species from the residue layer 228. Thus, desorption from a continuous and dense III-nitride layer 341 does not significantly affect the composition of the III-nitride layer 348. However, before the III-nitride layer 341 becomes continuous and dense, some species from the residue layer 228 can sublimate and can be deposited in the lower portion of the III-nitride layer 348 as silicon species 346 and dopant species 347. When a subsequent wafer is loaded into the chamber, the III-nitride layer 341 can act as a source of contaminant species in a similar manner for the subsequent wafer as the residue layer 114 acts for the substrate 102.

In addition to ionized acceptor species that are deposited in the silicon layer 236 due to desorption from the residue layer 114, the silicon layer 236 can also include ionized acceptor contaminant species 350 that diffuse down from the III-nitride layer 348. This diffusion can occur at significant rates because the substrate 102 is at an elevated temperature during the deposition process. In particular, gallium and aluminum can diffuse into the silicon layer 236 and act as ionized acceptor dopants, making the silicon layer 236 more p-type and more conductive. However, the flux of the dopant species 121 during growth of the silicon layer 236 can be selected to produce a concentration of deep-level dopants in the silicon layer 236 that is sufficient to compensate for both ionized acceptor contaminant species 226 originating in the residue layer 114 and ionized acceptor contaminant species 350 that have diffused from adjacent layers.

The deep-level dopant species 227 compensate for the p-type dopants present in the silicon layer 236 by acting as deep-level traps. As deep-level traps, the deep-level dopant species 227 provide recombination centers, which trap and localize free holes caused by the ionized acceptor contaminant species 226 and 350. This trapping lowers the free hole concentration in the silicon layer 236, making it more resistive. In some examples, the ionized acceptor contaminant species 226 are present in the silicon layer 236 at a concentration of approximately $10^{17}$ $cm^{-3}$. The ionized acceptor contaminant species 226 can be present at a concentration between $10^{15}$ and $10^{17}$ $cm^{-3}$, between $10^{14}$ and $10^{18}$ $cm^{-3}$, and/or between $10^{11}$ and $10^{20}$ $cm^{-3}$. To compensate for the free holes generated by these p-type dopants, the silicon layer 236 can contain at least an equivalent concentration of deep-level dopant species 227. Thus, in this example, the silicon layer 236 should contain a concentration of deep-level dopant species 227 of at least $10^{17}$ $cm^{-3}$, between $10^{15}$ and $10^{19}$ $cm^{-3}$, between $10^{16}$ and $10^{18}$ $cm^{-3}$, or higher than $10^{18}$ $cm^{-3}$. With the deep-level dopant species 227 compensating for the presence of free holes, the free hole concentration can be less than $10^{18}$ $cm^{-3}$, less than $10^{17}$ $cm^{-3}$, less than $10^{16}$ $cm^{-3}$, and/or less than $10^{15}$ $cm^{-3}$. In some examples, the deep-level dopant species 227 can act as a recombination center, even though the original deep-level trap states have been compensated by free holes. For example, the deep-level dopant species in the silicon layer 236 can re-capture electrons from the conduction band, which then recombine with other free holes. It is also possible that the deep-level dopant species 227 can directly capture free holes.

To act as a deep-level trap, the deep-level dopant species 227 should have an ionization energy that results in electron states well inside the band gap of the silicon layer 236, far from the band edges. These deep-level states should be separated from the conduction and valence band edges by significantly more than the thermal energy of electrons (kT) at room temperature. For example, the deep-level states can be separated from one or both of the band edges by between 0.3 and 0.5 eV. In some examples, the deep-level states can be separated from one or both of the band edges by between 0.2 and 0.6 eV, and/or by more than 0.6 eV. One or more of sulfur (S), vanadium (V), iron (Fe), selenium (Se), tantalum (Ta), tellurium (Te), chromium (Cr), manganese (Mn), and other chemical elements act as deep-level traps in silicon and can be used as the deep-level dopant species 227.

Figure 4:
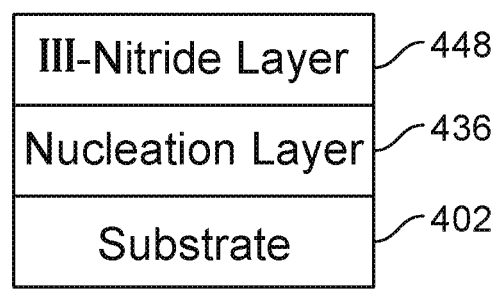
FIG. 4 depicts a semiconductor manufactured using the methods described herein, according to an illustrative implementation.

FIG. 4 depicts a semiconductor 400 manufactured using the methods described herein. The semiconductor 400 includes a substrate 402 (e.g., 102), a nucleation layer 436 (e.g., 236) over the substrate 402, and a III-nitride layer 448 (e.g., 348) over the nucleation layer 436. In some examples, the III-nitride layer 448 may be replaced with a III-V layer. Examples of III-V materials include one or more of GaAs, InP, InAs, InSb, InGaAs, GaAsP, InGaAsP, and the like. The substrate 402 can be a silicon substrate or a high-resistivity silicon substrate. In the example of a high-resistivity silicon substrate, the substrate can have a resistivity of greater than 1,000 ohm-cm, greater than 2,000 ohm-cm, greater than 3,000 ohm-cm, greater than 6,000 ohm-cm, or greater than 10,000 ohm-cm. The substrate 102 can be a silicon (111) substrate to facilitate epitaxial growth of the III-nitride layer 448. The thickness of the nucleation layer 436 can be approximately 1 μm, between 1 nm and 10 μm (microns or micrometers), between 1 nm and 100 nm, between 10 nm and 1 μm, between 100 nm and 1 μm, and/or between 100 nm and 10 μm.

The nucleation layer 436 buries contaminants and impurities present on the surface of the substrate 402. The contaminants and impurities may include species deposited on the surface of the substrate after desorbing from the chamber walls, as illustrated by species 118 in FIG. 1. The contaminants and impurities may also include adventitious carbon-containing species arising from species present in the environment and/or a native oxide resulting from oxidation of the substrate 402 by oxygen present in the ambient environment. A reducing atmosphere (typically comprising $H_2$ gas) before and during growth of the nucleation layer 436 can remove some or all of the carbon- and oxygen-containing contaminants and impurities, but the nucleation layer buries any contaminants and impurities that remain. In some examples, the nucleation layer 436 is thick enough that dislocations and other defects terminate within it and the upper surface of the nucleation layer 436 has a reduced defect density.

Furthermore, the nucleation layer 436 physically buries the contaminants and impurities, providing a clean surface for growth of the III-nitride layer 448. In some examples, the nucleation layer 436 does not contain deep-level dopants. In these examples, the nucleation layer 436 serves to provide a clean surface for growth of the III-nitride layer 448 but does not affect the carrier concentration by compensating for impurities that may be present. By physically burying contaminants and impurities, the nucleation layer 436 improves the film quality of the III-nitride layer 448, improving the performance of HEMT devices made using the semiconductor 400. By compensating ionized acceptor contaminant species, the nucleation layer 436 reduces or eliminates the formation of a parasitic conductive channel, improving the performance of HEMT devices made using the semiconductor 400.

The III-nitride layer 448 can include one or more constituent layers. The semiconductor 400 can be an epi-wafer, that is, a semiconductor wafer covered with blanket epitaxial layers and no lateral patterning. The epi-wafer may include one or more non-epitaxial capping layers as well. The epi-wafer can be further processed by lateral patterning to create transistors. In some examples, the semiconductor 400 is a wafer that has undergone such patterning. The semiconductor 400 can also include other layers (such as metal layers serving as contacts and/or interconnects) over the III-nitride layer 448 as well. In some examples, the semiconductor 400 is a portion of an epi-wafer, such as a chip that has been diced from an epi-wafer.

Figure 5:
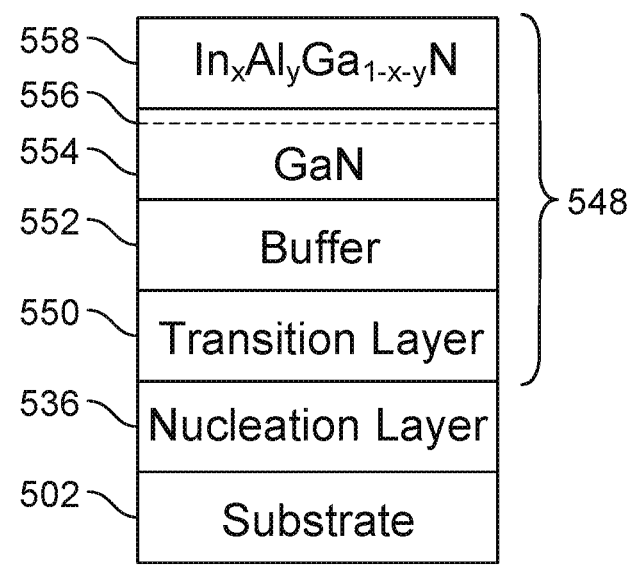
FIG. 5 depicts a semiconductor with III-nitride layers that can be used to manufacture a high electron mobility transistor (HEMT), according to an illustrative implementation.

FIG. 5 depicts a semiconductor 500 with III-nitride layers that can be used to manufacture a high electron mobility transistor (HEMT). The semiconductor 500 includes a substrate 502 (e.g., 402, 102) and a nucleation layer 536 (e.g., 436, 236) over the substrate 502. The semiconductor 500 also includes a III-nitride layer 548 (e.g., 348, 448). The III-nitride layer 548 comprises multiple layers, including a transition layer 550, a buffer layer 552, a gallium nitride (GaN) layer 554, and an indium aluminum gallium nitride ($In_xAl_yGa_{1-x-y}N$; $0 \leq x$, $y \leq 1$) layer 558. The $In_xAl_yGa_{1-x-y}N$ layer 558 can have a constant composition (i.e., constant values of x and y) through its thickness, or can have a varying composition (i.e., varying values of x and y) through its thickness. In some examples, the III-nitride layer can comprise one or more layers that include materials other than III-nitrides. The transition layer 550 may contain AlN and/or other alloys such as $In_xAl_yGa_{1-x-y}N$, and can serve to transition between the nucleation layer 536, which can be made of silicon and the buffer layer 552, which can comprise GaN. The buffer layer 552 can comprise a relatively thick GaN layer that is thick enough to be fully relaxed at its upper surface. The buffer layer 552 can also act to reduce a density of the defects due to lattice mismatch. The buffer layer can comprise any III-nitride material, such as GaN, $In_xAl_yGa_{1-x-y}N$, and/or AlN. In some examples, the composition of the buffer layer can vary throughout its thickness. The buffer layer can also comprise one or more superlattices or multiple layer structures with alternating layers of III-nitride materials.

Due to the heterojunction between the GaN layer 554 and the $In_xAl_yGa_{1-x-y}N$ layer 558, a two-dimensional electron gas (2DEG) forms in the GaN layer 554 near the GaN/$In_xAl_yGa_{1-x-y}N$ interface. The 2DEG 556 can provide a high-electron mobility channel in a HEMT. Other layers can be deposited over the semiconductor 500, including one or more of a capping layer, a metallization layer, and an isolation layer. Lateral patterning can be used to define lateral features such as transistors in the semiconductor 500. The semiconductor 500 can be an epi-wafer, and may include one or more non-epitaxial capping layers. In some examples, the semiconductor 500 includes one or more patterned features such as transistors. The semiconductor 500 can also include other layers (such as metal layers serving as contacts and/or interconnects) over the III-nitride layer 548 as well. In some examples, the semiconductor 500 is a portion of an epi-wafer, such as a chip.

By physically burying contaminants and impurities, the nucleation layer 536 improves the film quality of the III-nitride layer 548, improving the performance of HEMT devices made using the semiconductor 500. By compensating ionized acceptor contaminant species, the nucleation layer 536 reduces or eliminates the formation of a parasitic conductive channel, improving the performance of HEMT devices made using the semiconductor 500.

Figure 6:
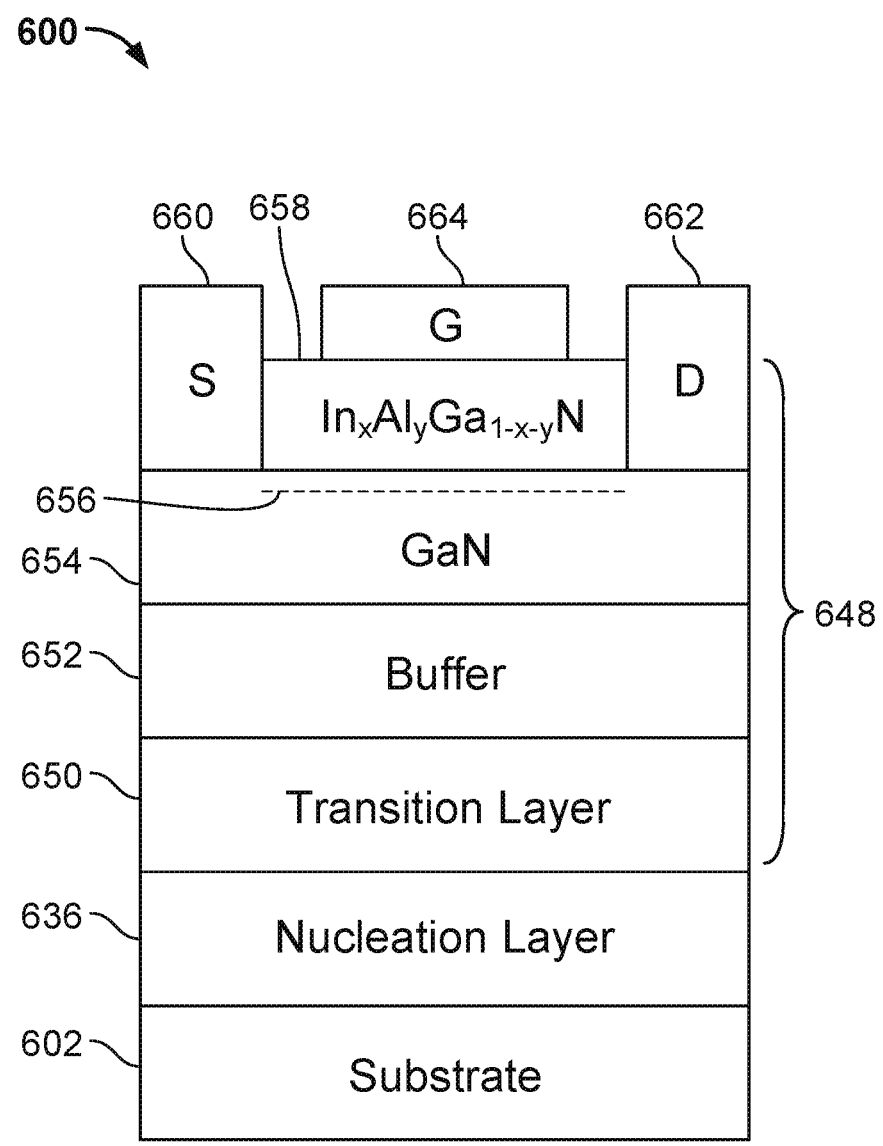
FIG. 6 depicts a HEMT manufactured using the methods described herein, according to an illustrative implementation.

FIG. 6 depicts a HEMT 600 manufactured using the methods described herein. The HEMT 600 can be manufactured from the semiconductor 500. The HEMT 600 includes a substrate 602 (e.g., 102, 402, 502) and a nucleation layer 636 (e.g., 236, 436, 536). The HEMT 600 also includes a III-nitride layer 648 (e.g., 348, 448, 548) over the nucleation layer 636. The III-nitride layer 648 includes a transition layer 650 (e.g, 550) over the nucleation layer 636, a buffer layer 652 (e.g., 552) over the AlN layer 650, a GaN layer 654 (e.g., 554) over the buffer layer 652, and an $In_xAl_yGa_{1-x-y}N$ ($0 \leq x$, $y \leq 1$) layer 658 (e.g., 558) over the GaN layer 654. The $In_xAl_yGa_{1-x-y}N$ layer 658 can have a constant composition (i.e., constant values of x and y) through its thickness, or can have a varying composition (i.e., varying values of x and y) through its thickness. The HEMT 600 also includes a 2DEG 656 (e.g., 556) in the gallium nitride layer 654 near its interface with the $In_xAl_yGa_{1-x-y}N$ layer 658. The III-nitride layer 648 can have a composition different than is depicted in FIG. 6. The III-nitride layer 648 in the HEMT 600 are laterally patterned using photolithography and etching techniques. Metallic contacts are deposited on the III-nitride layers to form a source contact 660, a drain contact 662, and a gate contact 664. Interconnects (not shown) can connect the contacts 660, 662, and 664 to a circuit. A gate voltage applied to the gate contact 664 can modulate the conductivity of the channel between the source contact 660 and the drain contact 662.

Because the 2DEG 656 provides a channel with high mobility, the HEMT 600 can be used for high-frequency switching. The switching can be at frequencies higher than 1 GHz, 50 GHz, or 60 GHz. At these high frequencies, any parasitic capacitance of the substrate 602 can reduce the performance of the HEMT 600. However, the nucleation layer 636 of the HEMT 600 includes deep-level dopants (e.g., 227) that act as traps and compensate for the presence of ionized acceptors, reducing or substantially preventing a parasitic channel and thus reducing or substantially preventing parasitic capacitance of the substrate 602. Accordingly, deep-level dopants (e.g., 227) in the nucleation layer 636 can improve the performance of the HEMT 600 at high frequencies. The increase in performance can be realized as one or both of operating at higher frequencies and increased gain at a given frequency. By physically burying contaminants and impurities, the nucleation layer 636 improves the film quality of the III-nitride layer 648, improving the performance of HEMT devices made using the semiconductor 600.

Figure 7:
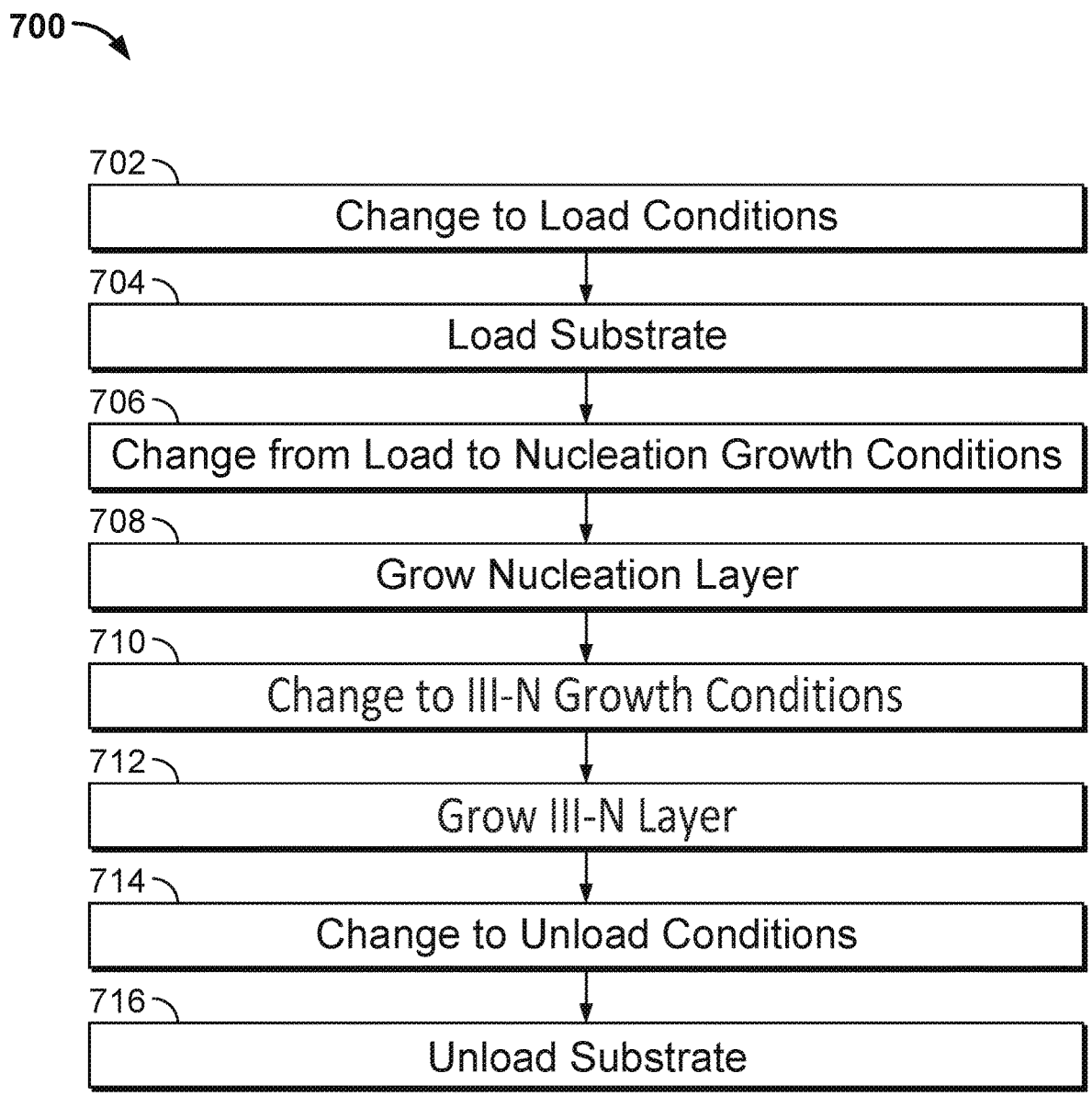
FIG. 7 depicts a flowchart of a method for growing semiconductors with nucleation layers that contain compensating deep-level dopants, according to an illustrative implementation.

FIG. 7 depicts a flowchart of a method 700 for growing semiconductors with nucleation layers that contain compensating deep-level dopants. The method 700 can be an MOCVD process and/or an organometallic vapor phase epitaxy (OMVPE) process. In some examples, the method 700 can be implemented using molecular beam epitaxy (MBE), halide vapor phase epitaxy (HYPE), pulsed laser deposition (PLD), and/or physical vapor deposition (PVD) instead of MOCVD. A substrate can be loaded directly into an epitaxial chamber or using a transfer (load-lock) chamber. At 702, conditions in the epitaxial chamber or load-lock chamber are adjusted to wafer loading conditions. The group of substrate holder is cooled to room temperature. A $N_2$ purge gas flow is adjusted to near 0. At 704, one or more substrates (e.g., 102, 402, 502, 602) is loaded into the epitaxial chamber or loaded into the load-lock chamber and then transferred into the epitaxial chamber. If the load-lock chamber is used, the epitaxial chamber remains under the base state conditions.

At 706, the epitaxial chamber conditions are adjusted to growth conditions for the nucleation layer (e.g., 236, 436, 536, 636). The one or more substrates (e.g., 102, 402, 502, 602) is heated to a temperature of 550-1200° C. The pressure in the epitaxial chamber is adjusted to 40-760 Torr. A very low pressure technique (<50 Torr) can be also employed. A purge gas flow of $H_2$, $N_2$, or a mixture of both, is adjusted to 1-1000 slm (standard liters per minute). In some examples, a carrier gas is not used. The precursors flow rate for the nucleation layer growth is controlled in the range of 1-500 μmol/min. Depending on the desired growth rate, the precursors flow rate can be also adjusted in the wide range of 0.1-5000 μmol/min.

At 708, the nucleation layer (e.g., 236, 436, 536, 636) is grown over the one or more substrates. Step 708 is continued for a predetermined time, corresponding to a desired thickness of the nucleation layer. The desired thickness can be approximately 1 μm, between 1 nm and 10 μm, between 1 nm and 100 nm, between 10 nm and 1 μm, between 100 nm and 1 μm, and/or between 100 nm and 10 μm. The nucleation layer includes deep-level dopants (e.g., 227) to compensate for contaminant species (e.g., 118, 350) that are present due to chamber contamination and/or diffusion. The flow rate of the deep-level dopant precursor (e.g., 121) is typically lower than the precursors flow rate for the main constituents of the nucleation layer and can be constant during the growth of the nucleation layer, or it can be adjusted during the growth. This flow rate can be reduced, even to zero, as the chamber walls become coated with silicon, blocking desorption of contaminant species from residue layers (e.g., 114) on the chamber walls. These conditions produce a concentration of deep-level dopants at the surface of the nucleation layer (e.g., 236, 436, 536, 636) nearest the one or more substrates (e.g., 102, 402, 502, 602) that is higher than the concentration at the surface of the nucleation layer nearest the III-nitride layer (e.g., 348, 448, 548, 648). Thus, the concentration of deep-level dopants is graded and tailored to be high in regions where the ionized acceptor concentration is high and low where the ionized acceptor concentration is low.

In some examples, the method 700 does not include flowing deep-level dopant precursors (e.g., 121) into the epitaxial chamber, and the nucleation layer (e.g, 236, 436, 536, 636) does not contain deep-level dopants. In these examples, the nucleation layer serves to provide a clean surface for growth of the III-nitride layers (e.g., 348, 448, 548, 648) but does not compensate for impurities present. The nucleation layer can provide a clean surface by burying impurities and defects present on the surface of the one or more substrates (e.g., 102).

At 710, the epitaxial chamber conditions are adjusted to conditions for III-nitride growth. The wafer (e.g., 102, 402, 605, 602) is heated to a temperature of about 550-1100° C. The pressure in the chamber is adjusted to 40-760 Torr. A very low pressure technique (<50 Torr) can be also employed. A purge gas flow of $H_2$, $N_2$, or a mixture of both, is adjusted to 1-1000 slm. In some examples, no purge gas can be used. The group III element precursors flow rate is controlled in the range of 10-500 μmol/min. The group V element precursor flow rate is controlled in the range of 0.001-10 mol/min. At 712, III-nitride layers (e.g., 348, 448, 548, 648) are grown over the nucleation layer. The III-nitride layers can include multiple layers, and can include non-III-V components.

At 714, the epitaxial chamber conditions are adjusted for unloading the one or more substrates. If the load-lock chamber is used for the substrate loading, the epitaxial chamber conditions are adjusted to the base state conditions. If the substrate unloading is carried out directly from the epitaxial chamber, the wafer (e.g., 102, 402, 605, 602) is cooled to about room temperature, or at least below about 450° C. An $N_2$ purge gas flow is adjusted to near 0. At 716, the one or more substrates are unloaded from the growth chamber.

Although the above description discloses III-nitride layers over a substrate that contains silicon, other material combinations are possible. The substrate can be made of one or more materials other than silicon. For example, the substrate can include one or more of sapphire, GaAs, GaN, InP, and other materials. The substrate can include a heterostructure between the nucleation layer and the III-nitride layer. The heterostructure may include multiple layers of different materials.

Examples of heterostructures include Si-on-insulator (SOI) and Si-on-sapphire (SOS) substrates. A nucleation layer could be grown over an SOI or an SOS substrate. The nucleation layer could be between the oxide layer and the Si layer, or above the Si layer, in an SOI or an SOS substrate. The Si layer of the SOI or SOS substrate could itself be the nucleation layer. The nucleation layer could be grown directly on the sapphire or handle wafer. A nucleation layer could be grown homogeneously with a layer of the same material but involved in a process similar to a heterostructure growth process, such as an epitaxial layer transfer process. In such an epitaxial layer transfer process, the epitaxial layer could comprise the nucleation layer. Thus, the epitaxial layer could include a first portion with deep-level dopants and a second portion that is unintentionally doped, or all of the epitaxial layer could be doped with deep-level dopants of constant or varying concentration.

In general, the nucleation layer can compensate either acceptor or donor contaminants by containing either deep-level donors or deep-level acceptors, respectively. The acceptor contaminants and ionized acceptor contaminants may be replaced with donor contaminants and ionized donor contaminants that provide free electrons to the semiconductor. The deep-level dopants may then include deep-level acceptor states which trap the free electrons, thus reducing the concentration of free electrons in the semiconductor.

A first layer described and/or depicted herein as "on" or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder.

From the above description of the method it is manifest that various techniques may be used for implementing the concepts of the method without departing from its scope. The described embodiments are to be considered in all respects as illustrative and not restrictive. It should also be understood that the method is not limited to the particular examples described herein, but can be implemented in other examples without departing from the scope of the claims. Similarly, while operations are depicted in the drawings in a particular order, this should not be understood as requiring that such operations be performed in the particular order shown or in sequential order, or that all illustrated operations be performed, to achieve desirable results.

What is claimed is:

1. A layered structure, comprising:
   a substrate;
   a nucleation layer over the substrate and having deep-level dopants; and
   a III-Nitride layer over the nucleation layer including:
      a transition layer;
      a buffer layer;
      a gallium nitride (GaN) layer; and
      a two-dimensional electron gas (2DEG) formed in the GaN layer;
   wherein:
      the nucleation layer comprises ionized contaminants, and
      a concentration of the deep-level dopants is at least as high as a concentration of the ionized contaminants.

2. The layered structure of claim 1, wherein a concentration of free holes in the substrate and in the nucleation layer is less than $10^{16}$ cm$^{-3}$.

3. The layered structure of claim 1, wherein the transition layer comprises indium aluminum gallium nitride in a form of $In_xAl_yGa_{1-x-y}N$ (0≤x, y≤1).

4. The layered structure of claim 1, wherein the buffer layer comprises indium aluminum gallium nitride in a form of $In_xAl_yGa_{1-x-y}N$ (0≤x, y≤1).

5. The layered structure of claim 1, wherein the III-Nitride layer further comprises:
   an indium aluminum gallium nitride layer in a form of $In_xAl_yGa_{1-x-y}N$ (0≤x, y≤1).

6. The layered structure of claim 1, wherein the buffer layer comprises one or more superlattices or multiple layer structures with alternating layers of III-nitride materials.

7. A high-electron mobility transistor device, comprising:
   a substrate;
   a nucleation layer over the substrate and having deep-level dopants, wherein the nucleation layer includes ionized contaminants, and wherein a concentration of the deep-level dopants is at least as high as a concentration of the ionized contaminants;
   a III-Nitride layer over the nucleation layer, the III-Nitride layer including:
      a transition layer,
      a buffer layer,
      a gallium nitride (GaN) layer, and
      a two-dimensional electron gas (2DEG) formed in the GaN layer;
   a source contact deposited on the III-Nitride layer;
   a drain contact deposited on the III-Nitride layer; and
   a gate contact deposited on the III-Nitride layer;
   wherein:
      a conductivity of a channel between source contact and drain contact is modulated by applying a voltage on the gate contact.

8. The high-electron mobility transistor device of claim 7, wherein the high-electron mobility transistor device exhibits a switching frequency higher than 1 GHz.

9. The high-electron mobility transistor device of claim 7, wherein
   a concentration of free holes in the substrate and in the nucleation layer is less than $10^{16}$ cm$^{-3}$.

10. The high-electron mobility transistor device of claim 7, wherein the transition layer comprises indium aluminum gallium nitride in a form of $In_xAl_yGa_{1-x-y}N$ (0≤x, y≤1).

11. The high-electron mobility transistor device of claim 7, wherein the buffer layer comprises indium aluminum gallium nitride in a form of $In_xAl_yGa_{1-x-y}N$ (0≤x, y≤1).

12. The high-electron mobility transistor device of claim 7, wherein the III-Nitride layer further comprises:
   an indium aluminum gallium nitride layer in a form of $In_xAl_yGa_{1-x-y}N$ (0≤x, y≤1).

13. The high-electron mobility transistor device of claim 7, wherein the buffer layer comprises one or more superlattices or multiple layer structures with alternating layers of III-nitride materials.

14. A method of forming a high-electron mobility transistor device, comprising:
   growing a nucleation layer over a substrate and having deep-level dopants, wherein the nucleation layer includes ionized contaminants, and wherein a concentration of the deep-level dopants is at least as high as a concentration of the ionized contaminants;
   growing a III-Nitride layer over the nucleation layer, the III-Nitride layer including:
      a transition layer,
      a buffer layer,
      a gallium nitride (GaN) layer, and
      a two-dimensional electron gas (2DEG) formed in the GaN layer;
   depositing a source contact on the III-Nitride layer;
   depositing a drain contact on the III-Nitride layer; and
   depositing a gate contact on the III-Nitride layer;

wherein:
a conductivity of a channel between source contact and drain contact is modulated by applying a voltage on the gate contact.

* * * * *